(12) United States Patent
Kouno

(10) Patent No.: US 10,056,450 B2
(45) Date of Patent: *Aug. 21, 2018

(54) SEMICONDUCTOR DEVICE

(71) Applicant: DENSO CORPORATION, Kariya, Aichi-pref. (JP)

(72) Inventor: Kenji Kouno, Kariya (JP)

(73) Assignee: DENSO CORPORATION, Kariya (JP)

( * ) Notice: Subject to any disclaimer, the term of this patent is extended or adjusted under 35 U.S.C. 154(b) by 24 days.

This patent is subject to a terminal disclaimer.

(21) Appl. No.: 15/123,404

(22) PCT Filed: Jan. 29, 2015

(86) PCT No.: PCT/JP2015/000393
§ 371 (c)(1),
(2) Date: Sep. 2, 2016

(87) PCT Pub. No.: WO2015/145929
PCT Pub. Date: Oct. 1, 2015

(65) Prior Publication Data
US 2017/0077216 A1    Mar. 16, 2017

(30) Foreign Application Priority Data
Mar. 25, 2014    (JP) ................. 2014-061813

(51) Int. Cl.
*H01L 29/06*    (2006.01)
*H01L 21/22*    (2006.01)
*H01L 27/06*    (2006.01)
*H01L 29/32*    (2006.01)
(Continued)

(52) U.S. Cl.
CPC .......... *H01L 29/063* (2013.01); *H01L 21/221* (2013.01); *H01L 27/0664* (2013.01);
(Continued)

(58) Field of Classification Search
CPC ............... H01L 21/221; H01L 27/0664; H01L 27/0727; H01L 29/0619; H01L 29/063;
(Continued)

(56) References Cited

U.S. PATENT DOCUMENTS

2002/0195651 A1    12/2002  Miura et al.
2005/0258493 A1    11/2005  Aono et al.
(Continued)

FOREIGN PATENT DOCUMENTS

JP    2008-192737 A    8/2008
JP    2008-192787 A    8/2008
JP    2008-218651 A    9/2008

*Primary Examiner* — Mark Tornow
*Assistant Examiner* — Priya Rampersaud
(74) *Attorney, Agent, or Firm* — Posz Law Group, PLC

(57) ABSTRACT

A semiconductor device includes a semiconductor substrate with: a drift layer; a base layer; and a collector layer and a cathode layer. In the semiconductor substrate, when a region operating as an IGBT device is an IGBT region and a region operating as a diode device is a diode region, the IGBT and diode regions are arranged alternately in a repetitive manner; a damaged region is arranged on a surface portion of the diode region in the semiconductor substrate. The IGBT and diode regions are demarcated by a boundary between the collector and cathode layers; and a surface portion of the IGBT region includes: a portion having the damaged region at a boundary side with the diode region; and another portion without the damaged region arranged closer to an inner periphery side relative to the boundary side.

5 Claims, 11 Drawing Sheets

(51) Int. Cl.
*H01L 29/861* (2006.01)
*H01L 29/739* (2006.01)
*H01L 27/07* (2006.01)
*H01L 29/10* (2006.01)
*H01L 29/66* (2006.01)
*H01L 29/40* (2006.01)
*H02M 7/00* (2006.01)

(52) U.S. Cl.
CPC ...... *H01L 27/0727* (2013.01); *H01L 29/0638* (2013.01); *H01L 29/0696* (2013.01); *H01L 29/1095* (2013.01); *H01L 29/32* (2013.01); *H01L 29/6609* (2013.01); *H01L 29/66348* (2013.01); *H01L 29/7397* (2013.01); *H01L 29/861* (2013.01); *H01L 29/8613* (2013.01); H01L 29/0619 (2013.01); H01L 29/407 (2013.01); *H02M 7/003* (2013.01)

(58) Field of Classification Search
CPC ............. H01L 29/0638; H01L 29/0696; H01L 29/1095; H01L 29/32; H01L 29/407; H01L 29/6609; H01L 29/66348; H01L 29/7397; H01L 29/861; H01L 29/8613; H02M 7/003
See application file for complete search history.

(56) References Cited

U.S. PATENT DOCUMENTS

| | | | |
|---|---|---|---|
| 2008/0093697 A1* | 4/2008 | Kaneda | H01L 29/0834 257/492 |
| 2008/0217649 A1* | 9/2008 | Arai | H01L 29/4236 257/139 |
| 2011/0175139 A1 | 7/2011 | Torii | |
| 2012/0043582 A1 | 2/2012 | Koyama et al. | |
| 2012/0132955 A1* | 5/2012 | Saito | H01L 27/0664 257/140 |
| 2012/0319163 A1 | 12/2012 | Tsuzuki et al. | |
| 2013/0009205 A1* | 1/2013 | Tsuzuki | H01L 29/7397 257/140 |
| 2013/0075784 A1* | 3/2013 | Ikeda | H01L 27/0727 257/140 |
| 2013/0260515 A1 | 10/2013 | Mizushima | |
| 2015/0206758 A1* | 7/2015 | Kato | H01L 21/265 438/459 |
| 2015/0228717 A1* | 8/2015 | Hara | H01L 29/0626 257/140 |
| 2016/0329323 A1* | 11/2016 | Iwasaki | H01L 29/32 |
| 2017/0084610 A1* | 3/2017 | Kouno | H01L 29/1095 |

* cited by examiner

WIDTH OF REGION WHERE DAMAGED REGION IS NOT ARRANGED WITH RESPECT TO WIDTH OF IGBT REGION

DIODE REGION | PERIPHERY REGION

SEMICONDUCTOR DEVICE

CROSS REFERENCE TO RELATED APPLICATION

This application is a U.S. national stage of International Application No. PCT/JP2015/000393 filed on Jan. 29, 2015 and is based on Japanese Patent Application No. 2014-61813 filed on Mar. 25, 2014, the disclosure of which are incorporated herein by reference.

TECHNICAL FIELD

The present invention relates to a semiconductor device having an IGBT (Insulated Gate Bipolar Transistor) region and a diode (Free Wheeling Diode) region.

BACKGROUND ART

There has been proposed a semiconductor device having an IGBT region in which an IGBT device is formed as a switching device used for an inverter or the like, and a diode region in which a diode device is formed (refer to Patent Literature 1, for example).

Specifically, the semiconductor device includes a base layer formed on the surface of a semiconductor substrate making up an N$^-$-type drift layer and a trench gate structure passing through the base layer. A P-type collector layer and an N-type cathode layer are formed on the back side of the semiconductor substrate, where an N-type emitter region is formed in an area of the base layer located above the collector layer. An upper electrode electrically connected to the base layer and the emitter region is formed on the front side of the semiconductor substrate, while a lower electrode electrically connected to the collector layer and the cathode layer is formed on the back side of the semiconductor substrate. That is, the IGBT region corresponds to a region in which the collector layer is formed on the back side of the semiconductor substrate, while the diode region corresponds to a region in which the cathode layer is formed on the back side of the substrate. In other words, a boundary between the collector layer and the cathode layer is a boundary between the IGBT region and the diode region in the aforementioned semiconductor device.

A damaged region is formed on the surface of the diode region of the semiconductor substrate by irradiating the entire surface with a helium beam.

According to such a semiconductor device, holes (excess carriers) within the drift layer can be vanished by recombination in the damaged region at the time of recovery of the diode device. As a result, the excess carriers contributing to a reverse current flowing through the diode device at the time of recovery can be decreased to be able to decrease the reverse current. Recovery characteristics of the diode device can thus be improved.

PRIOR ART LITERATURES

Patent Literature

Patent Literature 1: JP 2008-192737A

SUMMARY OF INVENTION

However, the aforementioned semiconductor device cannot stop holes flowing into the diode region (diode device) from the IGBT region (IGBT device) at the time of recovery of the diode device. This causes degradation in the recovery characteristics particularly in an area of the diode region on the side of the boundary with the IGBT region. The degradation in the recovery characteristics means an increase in a recovery current and thus an increased recovery loss and a decreased recovery capability.

An object of the present disclosure is to provide a semiconductor device capable of having improved recovery characteristics even in the area of the diode region on the side of the boundary with the IGBT region.

A semiconductor device with respect to an aspect of the present disclosure includes a semiconductor substrate having: a drift layer having a first conductivity type; a base layer having a second conductivity type that is arranged at a surface of the drift layer; and a collector layer having the second conductivity type and a cathode layer having the first conductivity type that are arranged on a side of the drift layer opposite to another side of the drift layer facing the base layer. When a region operating as an IGBT device in the semiconductor substrate is an IGBT region and a region operating as a diode device in the semiconductor substrate is a diode region, the IGBT region and the diode region are arranged alternately in a repetitive manner. A damaged region is arranged on a surface of the diode region in the semiconductor substrate.

The IGBT region and the diode region are demarcated by a boundary between the collector layer and the cathode layer; and a surface of the IGBT region includes: a portion having the damaged region, which has a length along a surface direction of the semiconductor substrate equal to or larger than the thickness of the semiconductor substrate, at a boundary side with the diode region; and another portion not having the damaged region arranged closer to an inner periphery side relative to the boundary side.

As a result, the recovery characteristics can be improved in the area of the diode region on the side of the boundary with the IGBT region while suppressing a decrease in an on-state voltage. That is, the recovery current is reduced to be able to reduce the recovery loss and improve the recovery capability.

In this case, the semiconductor substrate includes a periphery region surrounding the IGBT region and the diode region. The periphery region includes a collector layer of the second conductivity type formed adjacent to the cathode layer, is demarcated from the diode region by the boundary between the collector layer and the cathode layer, and includes, in the area of the surface on the side of the boundary with the diode region, the damaged region that is formed with the thickness twice or more the thickness of the semiconductor substrate along a surface direction of the semiconductor substrate.

As a result, the recovery characteristics can be improved in the area of the diode region on the side of the boundary with the periphery region.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
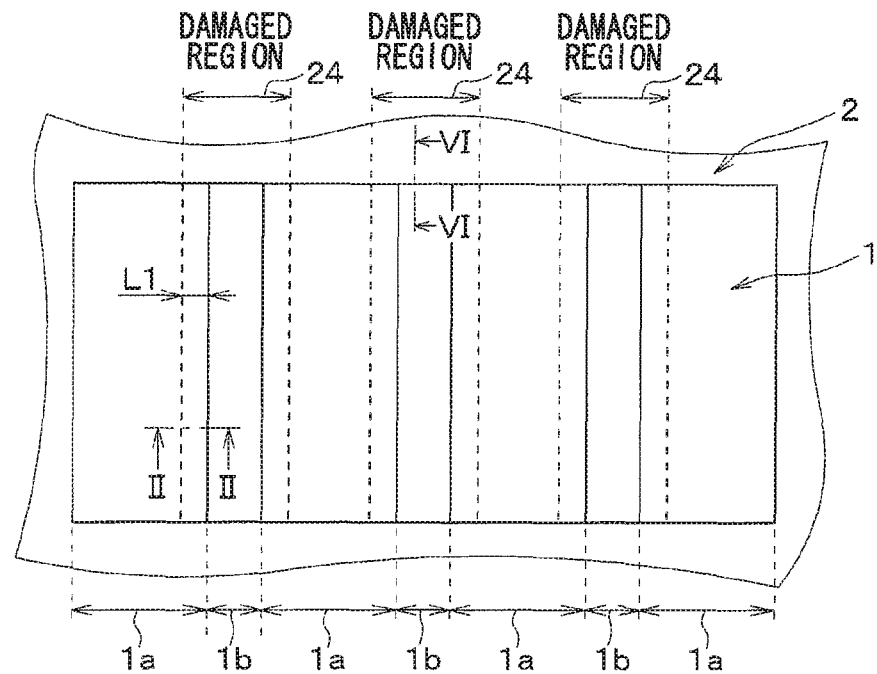
FIG. 1 is a schematic plan view of a semiconductor device according to a first embodiment of the present disclosure.

Embodiments of the present disclosure will now be described with reference to the drawings. Note that parts that are identical or equivalent to one another among the following embodiments will be assigned the same reference numeral and described.

First Embodiment

A first embodiment of the present disclosure will be described. Note that a semiconductor device of the present embodiment is suited for use as a power switching device employed in a power supply circuit such as an inverter or a DC/DC converter.

As illustrated in FIG. 1, the semiconductor device includes a cell region 1 and a periphery region 2 surrounding the cell region 1.

Figure 2:
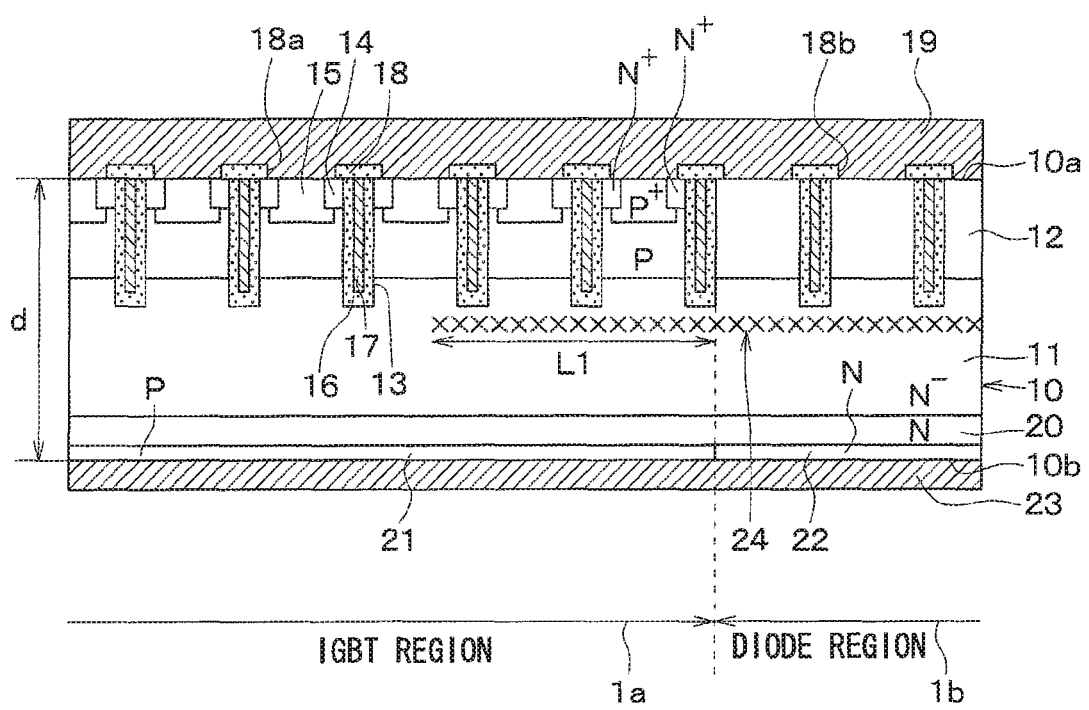
FIG. 2 is a cross-sectional view taken along line II-II of FIG. 1.

An IGBT region 1a in which an IGBT device is formed and a diode region 1b in which a diode device is formed are alternately formed in the cell region 1, as illustrated in FIGS. 1 and 2.

Specifically, the IGBT region 1a and the diode region 1b (cell region 1) are formed on an N$^-$-type semiconductor substrate 10 functioning as a drift layer 11. The IGBT region 1a and the diode region 1b extend along one direction (vertical direction with respect to FIG. 1) of one surface 10a of the semiconductor substrate 10 and are formed alternately in a direction orthogonal to the direction of extension.

A P-type base layer 12 with an impurity concentration of approximately $1.0 \times 10^{17}$ cm$^3$ is formed on the drift layer 11 (on the one surface 10a of the semiconductor substrate 10). A plurality of trenches 13 passing through the base layer 12 and reaching the drift layer 11 is formed to separate the base layer 12 into a plurality of pieces.

Note that in the present embodiment, the plurality of trenches 13 is formed at regular intervals along one direction (a depth direction with respect to FIG. 2) of surface directions of the one surface 10a of the semiconductor substrate 10. The one surface 10a of the semiconductor substrate 10 is formed of one surface of the base layer 12 on the reverse side of a surface thereof facing the drift layer 11.

The base layer 12 functions as a channel region in the IGBT region 1a. An N$^+$-type emitter region 14 and a P$^+$-type body region 15 sandwiched between the emitter regions 14 are formed in the base layer 12 as the channel region (the base layer 12 in the IGBT region 1a).

The emitter region 14 has a higher impurity concentration than the drift layer 11, terminates within the base layer 12, and is formed in contact with a side surface of the trench 13. On the other hand, the body region 15 has a higher impurity concentration than the base layer 12 and is formed to terminate within the base layer 12 as with the emitter region 14.

More specifically, the emitter region 14 extends in a rod shape while in contact with the side surface of the trench 13 along a longitudinal direction of the trench 13 in a region between the trenches 13, and terminates at an internal position relative to a tip of the trench 13. The body region 15 is interposed between two of the emitter regions 14 and extends in a rod shape along the longitudinal direction of the trench 13 (or along the emitter region 14). Note that the body region 15 of the present embodiment is formed deeper than the emitter region 14 relative to the one surface 10a of the semiconductor substrate 10.

Each trench 13 is filled with a gate insulating film 16 formed to cover an inner wall surface of each trench 13 and a gate electrode 17 made of polysilicon or the like and formed over the gate insulating film 16. A trench gate structure is formed as a result.

An interlayer insulating film 18 made of BPSG or the like is formed on the base layer 12 (on the one surface 10a of the semiconductor substrate 10). In the interlayer insulating film 18, a contact hole 18a exposing a part of the emitter region 14 and the body region 15 is formed in the IGBT region 1a, while a contact hole 18b exposing the base layer 12 is formed in the diode region 1b.

An upper electrode 19 is formed on the interlayer insulating film 18. The upper electrode 19 is electrically connected to the emitter region 14 and the body region 15 through the contact hole 18a, in the IGBT region 1a. In the diode region 1b, the upper electrode 19 is electrically connected to the base layer 12 through the contact hole 18b. In other words, the upper electrode 19 functions as an emitter electrode in the IGBT region 1a and as an anode electrode in the diode region 1b.

An N-type field stop layer (hereinafter simply referred to as an FS layer) 20 is formed on a side of the drift layer 11 opposite to the side facing the base layer 12 (on another surface 10b of the semiconductor substrate 10). The FS layer 20 is not necessarily required but is formed in order to improve pressure resistance and performance against a steady loss by preventing a depletion layer from spreading and control an amount of injection of a hole injected from the other surface 10b side of the semiconductor substrate 10.

In the IGBT region 1a, a P-type collector layer 21 is formed on a side opposite to the side of the drift layer 11 with the FS layer 20 interposed between the P-type collector layer 21 and the drift layer 11 and, in the diode region 1b, an N-type cathode layer 22 is formed on the side opposite to the side of the drift layer 11 with the FS layer 20 interposed between the N-type cathode layer 22 and the drift layer 11. That is, the IGBT region 1a and the diode region 1b are demarcated by the layers formed on the other surface 10b side of the semiconductor substrate 10, the layers being the collector layer 21 and the cathode layer 22. In other words, the boundary between the IGBT region 1a and the diode region 1b is determined by the boundary between the collector layer 21 and the cathode layer 22.

Note that in the present embodiment, the other surface 10b of the semiconductor substrate 10 is formed of the collector layer 21 and the cathode layer 22. Moreover, in the present embodiment, the collector layer 21 is formed on an opposite side of the base layer 12, in which the emitter region 14 and the body region 15 are formed, while interposing the FS layer 20 between the collector layer and the base layer. The cathode layer 22 is formed on the opposite side of the base layer 12, in which the emitter region 14 and the body region 15 are not formed, while interposing the FS layer 20 between the cathode layer and the base layer. That is, in the present embodiment, the boundary between the IGBT region 1a and the diode region 1b is the boundary between the base layer 12 in which the emitter region 14 and the body region 15 are formed and the base layer 12 in which the emitter region 14 and the body region 15 are not formed.

In the semiconductor substrate 10, as described above, the base layer 12 is formed on the one surface 10a, while the collector layer 21 and the cathode layer 22 are formed on the other surface 10b. The semiconductor substrate 10 can thus be said to have a structure in which the collector layer 21 and the cathode layer 22, the FS layer 20, the drift layer 11, and the base layer 12 are stacked in this order.

A lower electrode 23 is formed on the collector layer 21 and the cathode layer 22 (on the other surface 10b of the semiconductor substrate 10). The lower electrode 23 functions as a collector electrode in the IGBT region 1a and as a cathode electrode in the diode region 1b.

As a result, the aforementioned structure allows for a PN junction between the base layer 12 as an anode and the drift layer 11, the FS layer 20 and the cathode layer 22 as a cathode to form a diode device in the diode region 1b.

A damaged region 24 is formed in the vicinity to the one surface 10a (surface) of the semiconductor substrate 10. Specifically, the damaged region 24 is formed in the diode region 1b and extends from the diode region 1b into the IGBT region 1a. That is, the damaged region 24 is formed in the diode region 1b as well as in a part of the IGBT region 1b in the vicinity to the boundary with the diode region 1a, Accordingly, holes (excess carriers) in the drift layer 11 in the IGBT region 1a recombine with the damaged region 24 formed in the IGBT region 1a and vanish, whereby injection of the holes from the IGBT region 1a into the diode region 1b can be prevented.

The relationship between the damaged region 24 formed in the IGBT region 1a and the thickness of the semiconductor substrate 10 will now be described. In the following description, the thickness of the semiconductor substrate 10 is denoted as d, the width of the damaged region 24 formed in the IGBT region 1a is denoted as L1, and the width of the damaged region 24 formed in the IGBT region 1a with respect to the thickness of the semiconductor substrate 10 is denoted as a first thickness ratio (L1/d).

Note that the width L1 of the damaged region 24 formed in the IGBT region 1a corresponds to the length along the arrangement of the IGBT region 1a and the diode region 1b (length in a horizontal direction with respect to FIG. 2) out of lengths in the surface direction of the one surface 10a of the semiconductor substrate 10.

Figure 3:
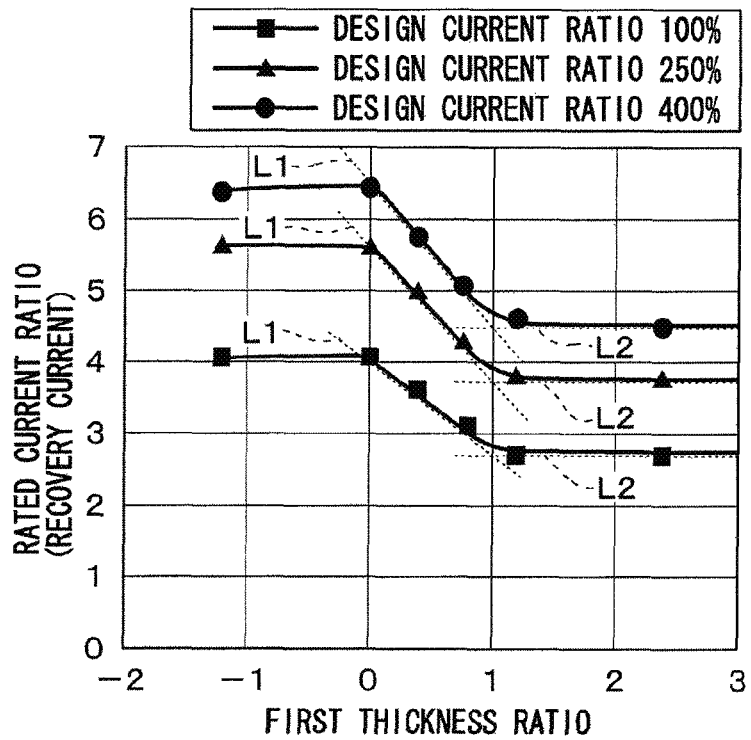
FIG. 3 is a graph illustrating a simulation result of a relationship between a first thickness ratio and a rated current ratio.

As illustrated in FIG. 3, a rated current ratio decreases sharply when the first thickness ratio (L1/d) exceeds zero, but is nearly unchanged once the first thickness ratio (L1/d) exceeds one. In other words, a line L1 tangent to the point where the rated current ratio changes sharply and a line L2 tangent to the point where the rated current ratio is nearly unchanged intersect at the point where the first thickness ratio (L1/d) equals one. Accordingly, in the present embodiment, the damaged region 24 is formed such that the first thickness ratio (L1/d) equals one or larger.

Note that the rated current ratio of the present embodiment (in FIG. 3) refers to a recovery current with respect to the current flowing while the IGBT device (semiconductor device) is switched on. The decrease in the rated current ratio thus means a decrease in the recovery current. A design current ratio of the present embodiment (in FIG. 3) refers to a test current (an on-state current flowing through the IGBT device) with respect to an allowable current (design current) of the IGBT device. In FIG. 3, the first thickness ratio (L1/d) equals zero when the damaged region 24 is formed only in the diode region 1b and the first thickness ratio (L1/d) equals a negative value when the damaged region 24 is not formed in an area of the diode region 1b closer to the IGBT region 1a.

Figure 4:
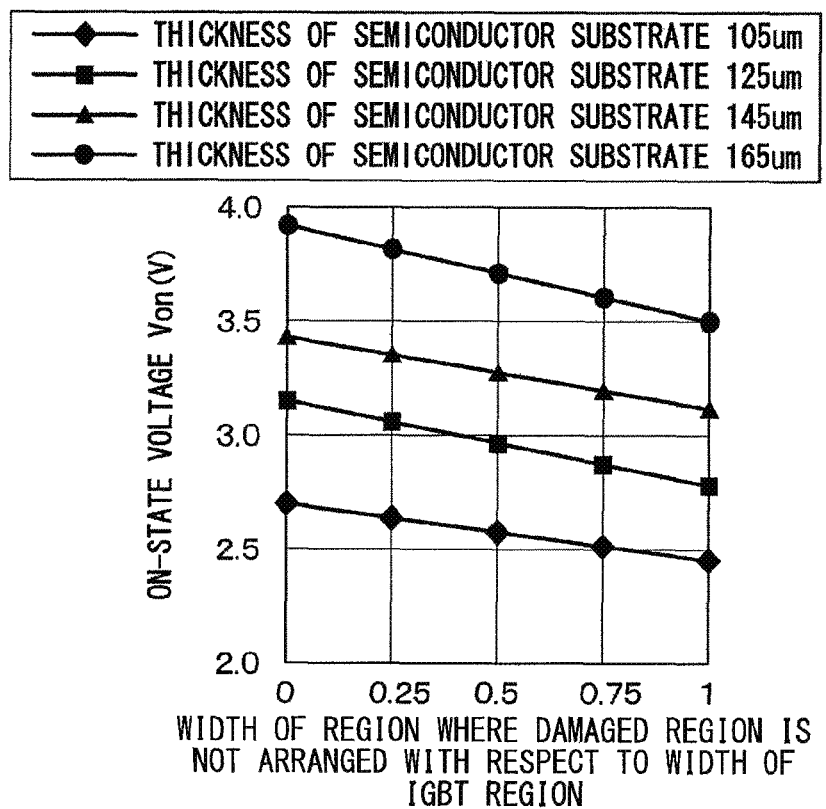
FIG. 4 is a graph illustrating a relationship between the width of a damaged region relative to the width of an IGBT region and an on-state voltage.

The damaged region 24 formed in the IGBT region 1a causes the holes to vanish even when the IGBT device is operated normally, thereby causing an on-state voltage to increase. That is, as illustrated in FIG. 4, the on-state voltage increases as the ratio of the width of the damaged region 24 to the width of the IGBT region 1a increases.

Therefore, the damaged region 24 with the first thickness ratio (L1/d) of one or larger is formed in the area of the IGBT region 1a in the vicinity to the boundary with the diode region 1b, and is not formed in an area closer to the periphery relative to the area in the vicinity to the boundary. It is preferable, for example, that the damaged region 24 is not formed in an area corresponding to one half or more of the width of the IGBT region 1a. In other words, the IGBT region 1a is preferably formed such that the width of the area in which the damaged region 24 is not formed equals one half or more of the width of the entire region.

Note that the width of the IGBT region 1a corresponds to the length along the arrangement of the IGBT region 1a and the diode region 1b (length in the horizontal direction with respect to FIG. 1) out of lengths in the surface direction of the one surface 10a of the semiconductor substrate 10.

Figure 5:
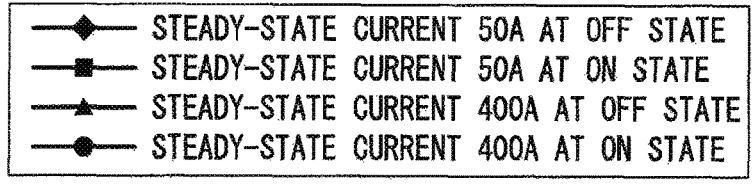
FIG. 5 is a graph illustrating a relationship between the width of the damaged region relative to the width of the IGBT region and a switching loss.

The switching loss does not change as illustrated in FIG. 5, even when the damaged region 24 is formed in the IGBT region 1a as described above. A steady-state current in FIG. 5 refers to a current flowing while the IGBT device (semiconductor device) is switched on.

The structure of the cell region 1 of the present embodiment has been described. Next, the structure of the periphery region 2 formed around the cell region 1 will be described.

Figure 6:
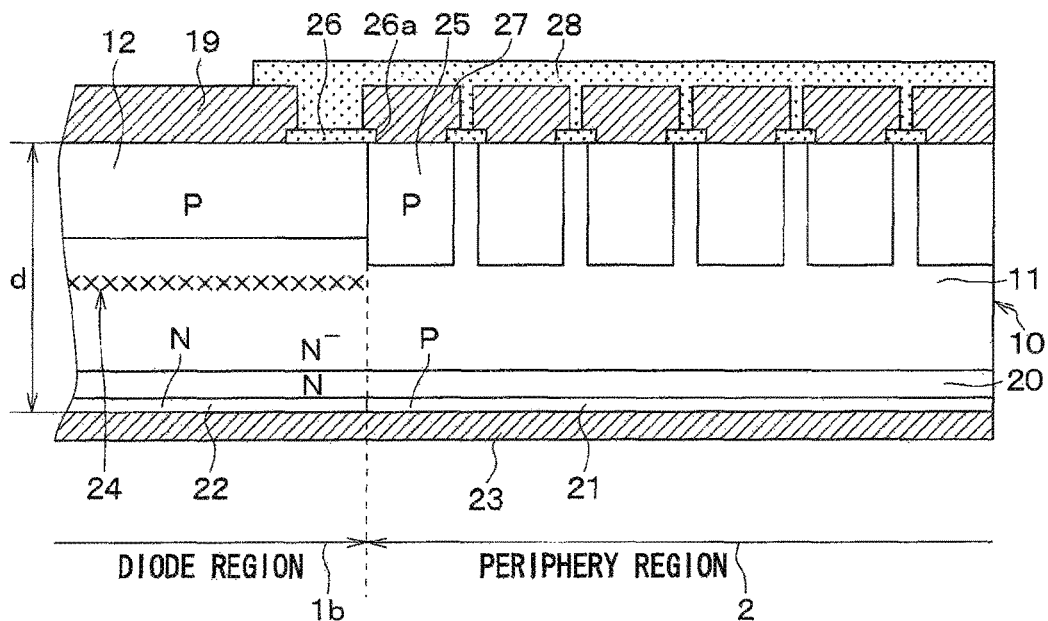
FIG. 6 is a cross-sectional view taken along line VI-VI of FIG. 1.

A plurality of P-type guard rings 25 is formed as a multiple ring structure on the side of the one surface 10a of the semiconductor substrate 10 in the periphery region 2, as illustrated in FIG. 6. Each guard ring 25 has an impurity concentration of approximately $1.0 \times 10^{18}$ cm$^3$ which is higher than that of the base layer 12. Moreover, in the present embodiment, the guard ring 25 closest to the cell region 1 is formed in contact with the base layer 12 of the diode region 1b.

An oxide film 26 is formed on the guard ring 25. A part of the oxide film 26 corresponding to the guard ring 25 is provided with an opening 26a. A peripheral electrode 27 is formed on the oxide film 26 and is electrically connected to the guard ring 25 through the opening 26a formed in the oxide film 26. A passivation film 28 is formed to cover and protect the peripheral electrode 27.

On the side of the other surface 10b of the semiconductor substrate 10, a P-type collector layer 21 is formed on a side opposite to the drift layer 11 while interposing the FS layer 20 between the P-type collector layer 21 and the drift layer 11. That is, the diode region 1b and the periphery region 2 are demarcated by the layers formed on the other surface 10b side of the semiconductor substrate 10, the layers being the collector layer 21 and the cathode layer 22. In other words, the boundary between the diode region 1b and the periphery region 2 is formed by the boundary between the collector layer 21 and the cathode layer 22.

In the present embodiment, the collector layer 21 is formed on the opposite side of the guard ring 25 with the FS layer 20 interposed between the collector layer 21 and the guard ring 25. The cathode layer 22 is formed on the opposite side of the base layer 12 with the FS layer 20 interposed between the cathode layer 22 and the base layer 12. That is, in the present embodiment, the boundary between the diode region 1b and the periphery region 2 corresponds to the boundary between the guard ring 25 and the base layer 12.

The semiconductor device of the present embodiment is constructed as described above. Note that in the present embodiment, the N type, N type and N$^+$ type correspond to a first conductivity type of the present disclosure, while the P type and P$^+$ type correspond to a second conductivity type of the present disclosure.

Figure 7:
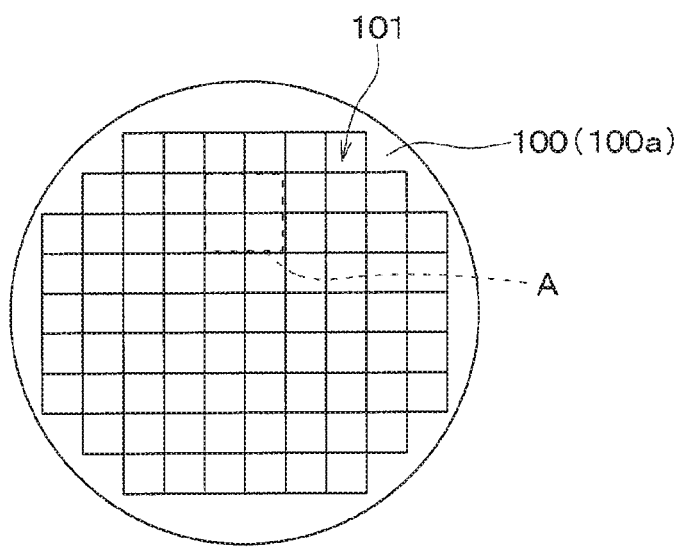
FIG. 7 is a schematic plan view of a wafer provided to manufacture the semiconductor device illustrated in FIG. 1.

A method of manufacturing the aforementioned semiconductor device will now be described. First, as illustrated in FIG. 7, there is prepared an N$^-$-type wafer 100 including a plurality of chip forming regions 101.

The base layer 12 is then formed on the side of one surface 100a of the wafer 100 by thermal diffusion or the like, followed by the formation of the trench gate structure, the emitter region 14 and the body region 15 in each chip forming region. The interlayer insulating film 18 is formed on the base layer 12, and the contact holes 18a and 18b are formed in the interlayer insulating film 18. The upper electrode 19 is then formed on the interlayer insulating film 18 to be electrically connected to the emitter region 14 and the body region 15 through the contact hole 18a and to the base layer 12 through the contact hole 18b.

A back surface side of the wafer 100 is subjected to grinding and etching to obtain a desired thickness. The thickness is about 120 μm for a 1200 V IGBT device and about 80 μm for an 800 V device, for example. After that, the FS layer 20 is formed on the back surface of the wafer, followed by the formation of the collector layer 21 and the cathode layer 22 on the opposite side of the drift layer 11 with the FS layer 20 interposed between the drift layer 11 and the collector layer 21, the cathode layer 22.

Figure 8:
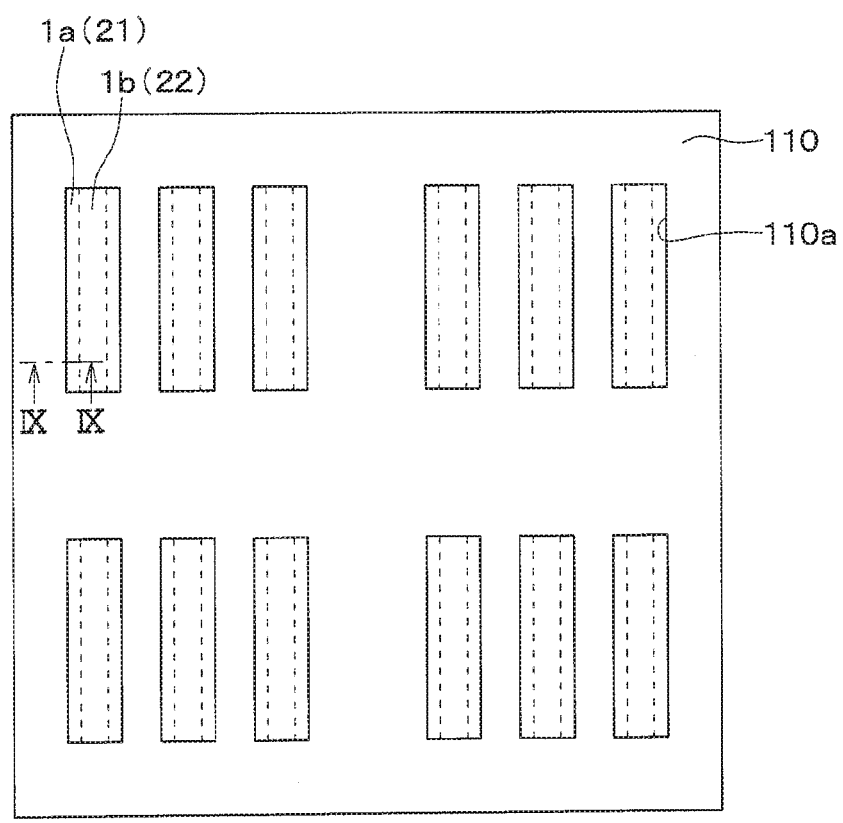
FIG. 8 is a schematic plan view when a mask is arranged on another surface side of the wafer.
Figure 9:
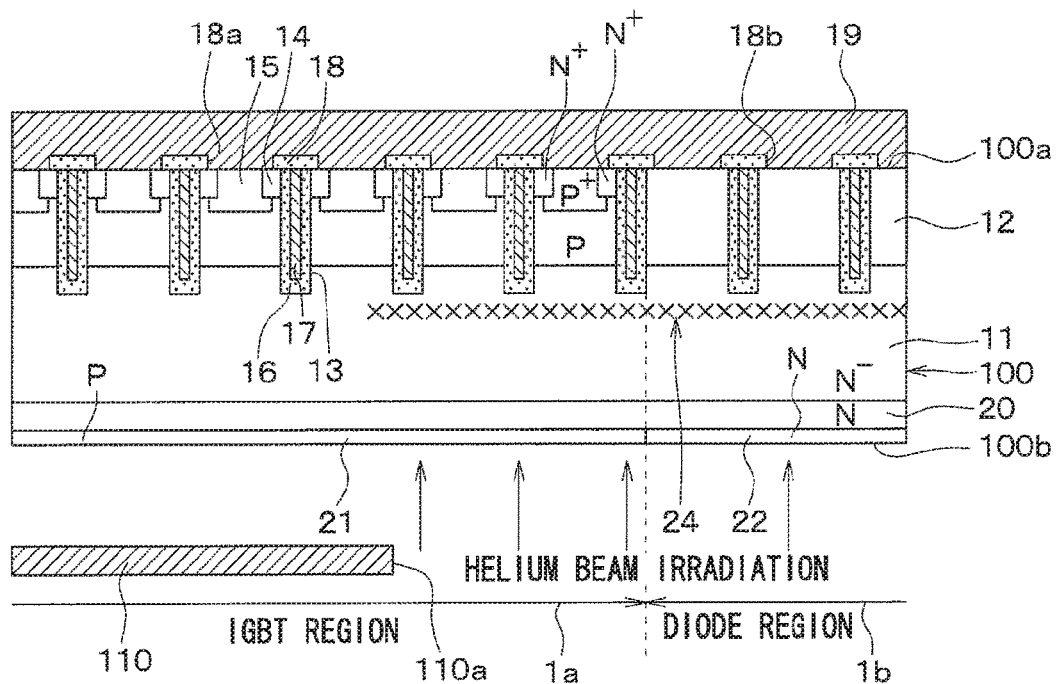
FIG. 9 is a cross-sectional view taken along line IX-IX of FIG. 8.

Next, as illustrated in FIGS. 8 and 9, there is prepared a mask 110 with an opening 110a opposing to the diode region 1b (cathode layer 22) and the area of the IGBT region 1a closer to the boundary with the diode region 1b (a part of the collector layer 21), and the mask 110 is placed on the other surface 100b side of the wafer 100. A helium beam is radiated from the other surface 100b side of the wafer 100 to form the damaged region 24 having the aforementioned structure. Note that FIG. 8 corresponds to an enlarged view of a region A in FIG. 7.

After that, the lower electrode 23 is formed on the other surface 100b of the wafer 100, which is divided into chips so that the semiconductor device is manufactured. The periphery region 2 including the guard ring 25 and the peripheral electrode 27 is formed in the aforementioned process or a process specific to the periphery region.

According to the present embodiment described above, the IGBT region 1a includes the area which is closer to the boundary with the diode region 1b and in which the damaged region 24 with the first thickness ratio (L1/d) of one or larger is formed, and the area in which the damaged region 24 is not formed. This can suppress the decrease in the on-state voltage as well as injection of the holes from the IGBT region 1a into the diode region 1b. That is, the recovery characteristics can be improved in the area of the diode region 1b on the side of the boundary with the IGBT region 1a while suppressing the decrease in the on-state voltage. Therefore, the recovery current is reduced to be able to reduce the recovery loss and improve the recovery capability while suppressing the decrease in the on-state voltage.

Second Embodiment

A second embodiment of the present disclosure will be described. Unlike the first embodiment, a damaged region 24 is also formed in a periphery region 2 in the present embodiment. The rest is similar to the first embodiment and thus will not be described.

Figure 10:
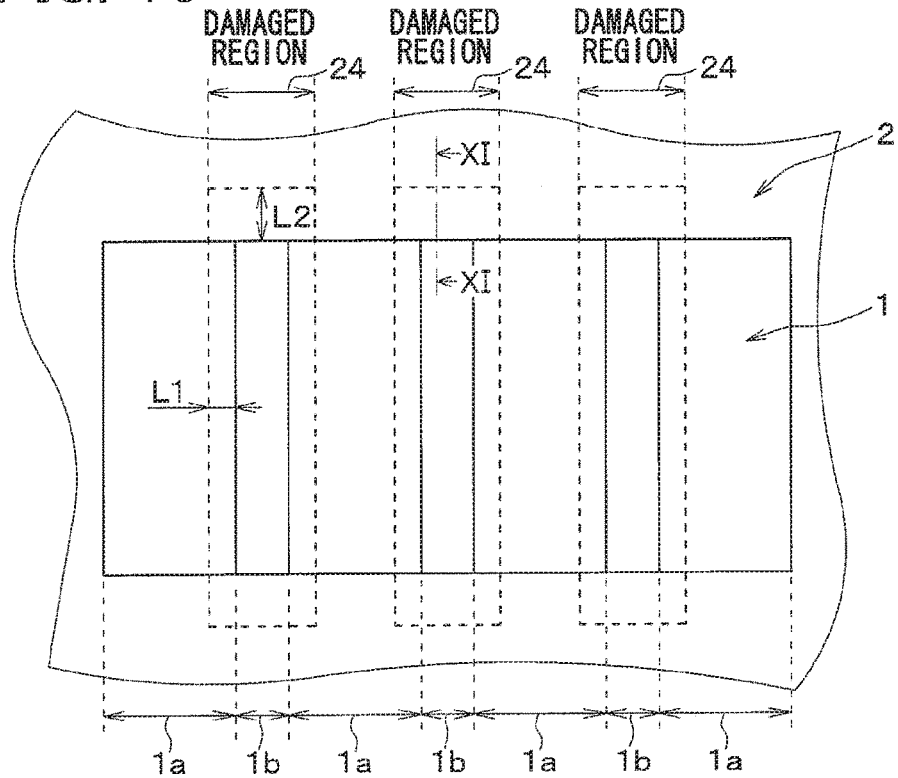
FIG. 10 is a schematic plan view of a semiconductor device according to a second embodiment of the present disclosure.
Figure 11:
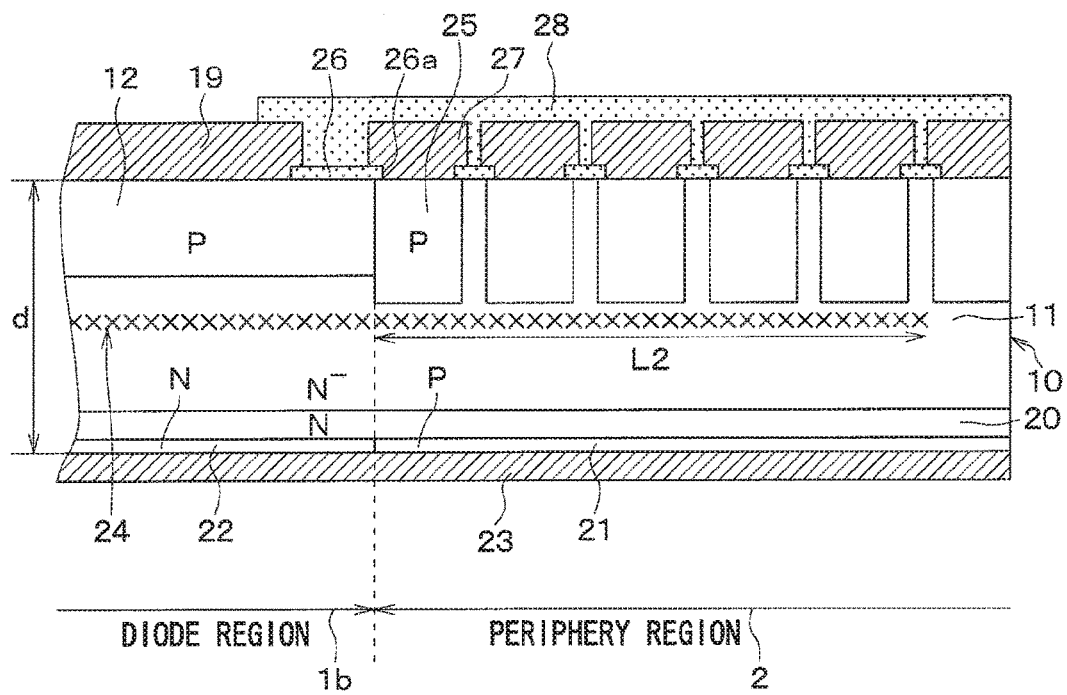
FIG. 11 is a cross-sectional view taken along line XI-XI of FIG. 10.

As illustrated in FIGS. 10 and 11, the damaged region 24 formed in a diode region 1b extends into the periphery region 2 in the present embodiment. As a result, holes (excess carriers) in a drift layer 11 in the periphery region 2 recombine with the damaged region 24 formed in the periphery region 2 and vanish, whereby injection of the holes from the periphery region 2 into the diode region 1b can be prevented.

The relationship between the damaged region 24 formed in the periphery region 2 and the thickness of a semiconductor substrate 10 will now be described. In the following description, the width of the damaged region 24 formed in the periphery region 2 is denoted as L2, and the width of the damaged region 24 formed in the periphery region 2 with respect to the thickness of the semiconductor substrate 10 is denoted as a second thickness ratio (L2/d).

Note that the width L2 of the damaged region 24 formed in the periphery region 2 corresponds to the length along the extension of the diode region 1b (length in a horizontal direction with respect to FIG. 11) out of lengths in a surface direction of one surface 10a of the semiconductor substrate 10.

Figure 12:
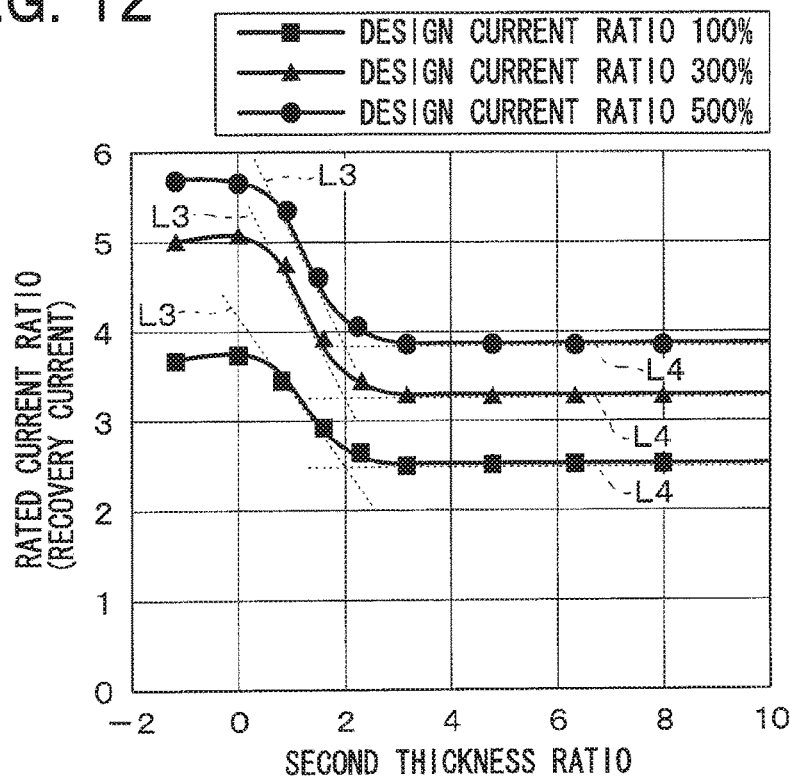
FIG. 12 is a graph illustrating a simulation result of a relationship between a second thickness ratio and a rated current ratio.

As illustrated in FIG. 12, a rated current ratio decreases sharply when the second thickness ratio (L2/d) exceeds zero, but is nearly unchanged once the second thickness ratio (L2/d) exceeds two. In other words, a line L3 tangent to the point where the rated current ratio changes sharply and a line L4 tangent to the point where the rated current ratio is nearly unchanged intersect at the point where the second thickness ratio (L2/d) equals two. Accordingly, the damaged region 24 is formed such that the second thickness ratio (L2/d) equals two or larger in the present embodiment.

Note that in FIG. 12, the second thickness ratio (L2/d) equals zero when the damaged region 24 is formed only in the diode region 1b. The second thickness ratio (L2/d) equals a negative value when the damaged region 24 is not formed in an area of the diode region 1b on the side of the periphery region 2.

Figure 13:
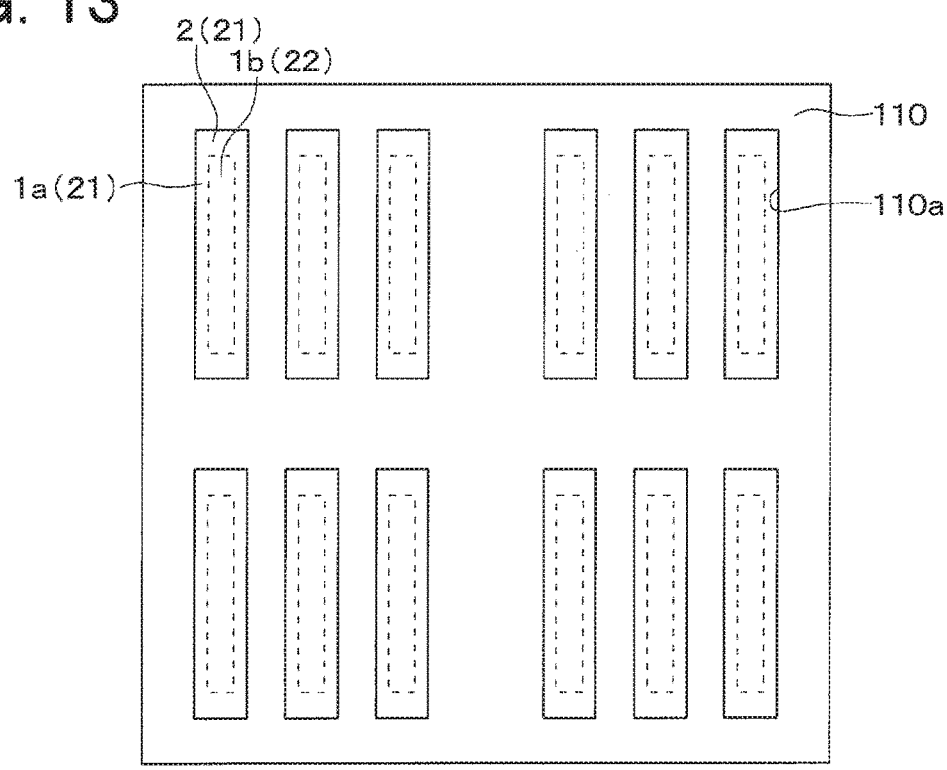
FIG. 13 is a schematic plan view when a mask is arranged on another surface side of a wafer.

When such a semiconductor device is irradiated with the helium beam illustrated in FIG. 9, there may be prepared a mask 110 with an opening 110a opposing to an area of the periphery region 2 on the side of the boundary with the diode region 1b (a part of a collector layer 21), as illustrated in FIG. 13. Note that FIG. 13 corresponds to an enlarged view of a region A in FIG. 7.

According to the present embodiment described above, the damaged region 24 with the second thickness ratio (L2/d) of two or larger is formed in the area of the periphery region 2 on the side of the boundary with the diode region 1b. As a result, the injection of the holes from the periphery region 2 into the diode region 1b can be prevented and, at the same time, recovery characteristics can be improved in the area of the diode region 1b on the side of the boundary with the periphery region 2.

Third Embodiment

A third embodiment of the present disclosure will be described. The shape of a damaged region 24 of the present embodiment is modified from that of the second embodiment. The rest is similar to the first embodiment and thus will not be described.

Figure 14:
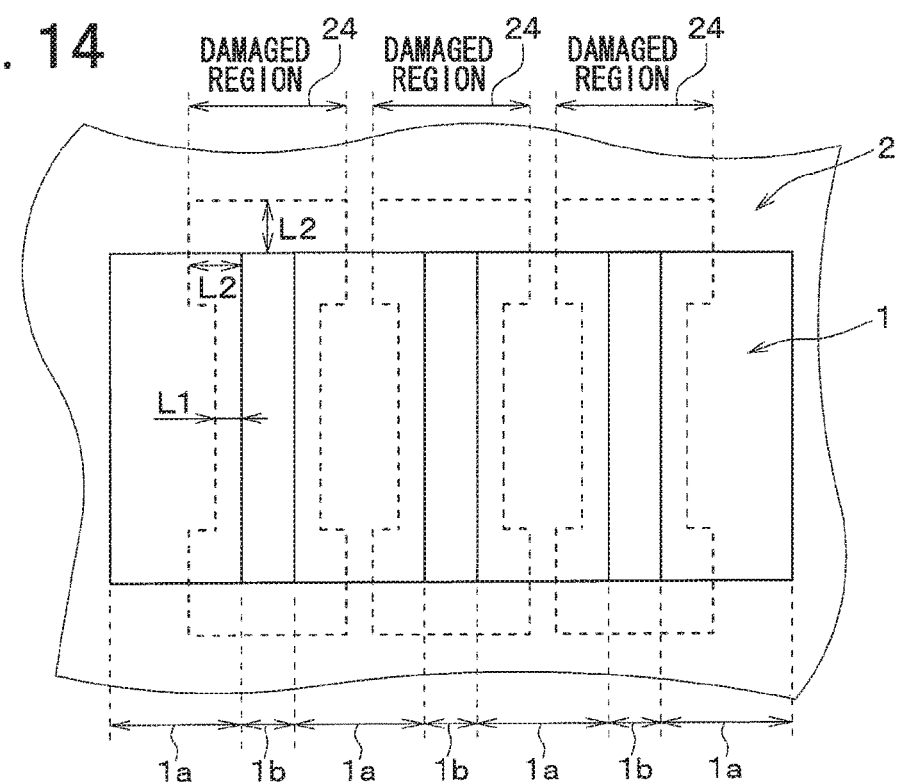
FIG. 14 is a schematic plan view of a semiconductor device according to a third embodiment of the present disclosure.

In the present embodiment, as illustrated in FIG. 14, the width of the damaged region 24 formed in an IGBT region 1a is larger in an area formed on both end sides of the boundary between a diode region 1b and the IGBT region 1a than in an area formed at the center between both ends. Specifically, the width (length in a horizontal direction with respect to FIG. 14) of the area formed on both end sides of the boundary with the diode region 1b in the IGBT region 1a is denoted as L2.

As a result, injection of holes from the periphery region 2 into the diode region 1b through the IGBT region 1a can be prevented and, at the same time, recovery characteristics of the diode region 1b can be improved.

Note that when such a semiconductor device is irradiated with the helium beam illustrated in FIG. 9, there may be prepared a mask 110 with an opening 110a formed to form the aforementioned damaged region 24.

OTHER EMBODIMENTS

The present disclosure is not to be limited to the aforementioned embodiments but can be modified as appropriate without departing from the claims.

While the first conductivity type and the second conductivity type correspond to the P type and the N type in the example described in the first embodiment, respectively, the first conductivity type and the second conductivity type may correspond to the N type and the P type, respectively.

Each of the base layer 12 (channel region) formed in the IGBT region 1a and the base layer 12 (anode) formed in the diode region 1b may have a different impurity concentration in each of the aforementioned embodiments.

A damaged layer different from the damaged region 24 may also be formed on the other surface 10b side of the semiconductor substrate 10, in each of the aforementioned embodiments. The damaged layer formed in the IGBT region is can thus cause the excess carrier in the drift layer 11 in the IGBT region 1a to undergo recombination and vanish, whereby favorable trade-off characteristics between a switching loss and a steady loss can be obtained in the IGBT device. Moreover, the damaged layer formed in the diode region 1b can cause the excess carrier in the drift layer 11 in the diode region 1b to undergo recombination and vanish, whereby favorable trade-off characteristics between a switching loss and a steady loss can be obtained in the diode device.

The IGBT device in each of the aforementioned embodiments may be of a planar type, not the trench gate type.

Figure 15A:
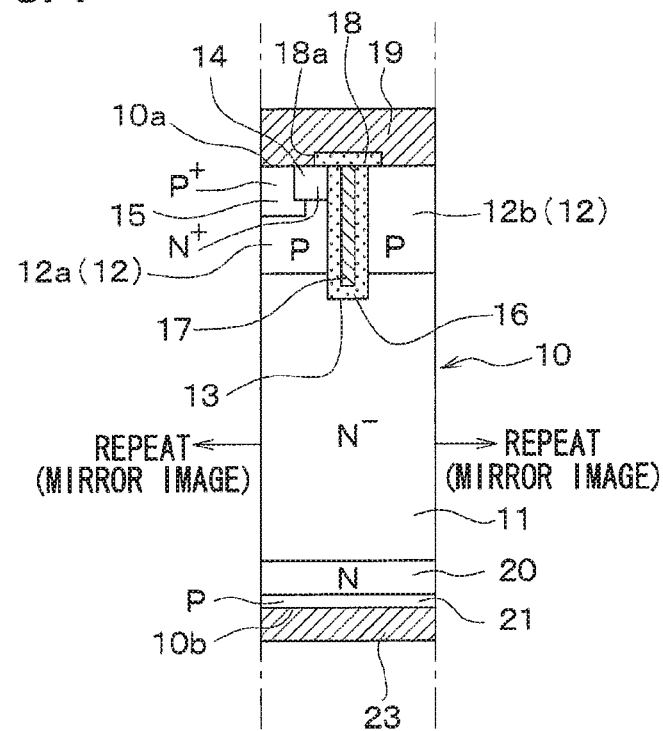
FIG. 15A is a diagram illustrating a structure of the smallest unit of an IGBT device according to another embodiment of the present disclosure.

Then, in each of the aforementioned embodiments, the IGBT region 1a may be formed by repeatedly forming a mirror image of a structure in which an emitter region 14 and a body region 15 are appropriately left out as illustrated in FIG. 15A. In this case, a base layer 12 is split by a trench 13 into a channel region 12a in which the emitter region 14 is formed and a float region 12b in which the emitter region 14 is not formed.

Figure 15B:
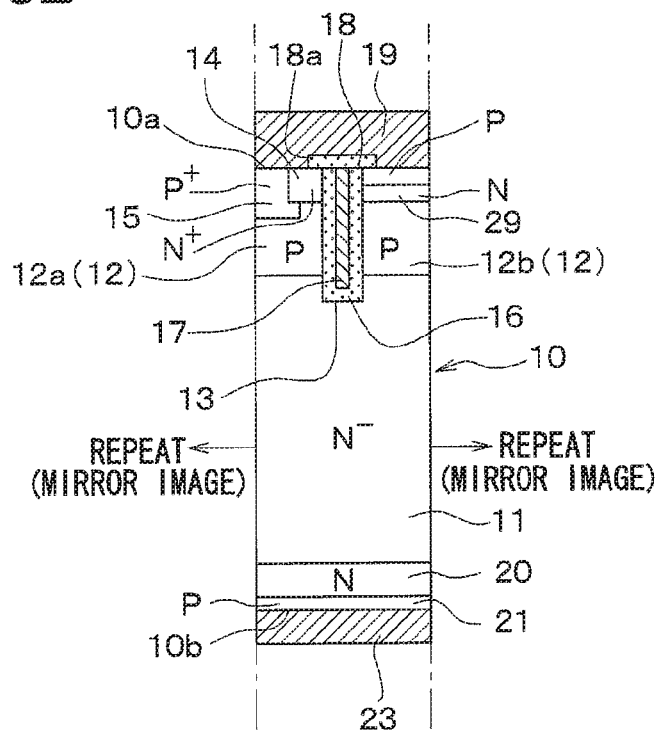
FIG. 15B is a diagram illustrating a structure of the smallest unit of an IGBT device according to another embodiment of the present disclosure.

Alternatively, the IGBT region 1a may be formed by repeatedly forming a mirror image of a structure in which an N-type hole stopper layer (HS layer) 29 splitting the float region 12b along a depth direction is formed in the float region 12b, as illustrated in FIG. 15B. The hole stopper layer 29 can thus prevent holes in a drift layer 11 from going out to an upper electrode 19 through the float region 12b.

Figure 15C:
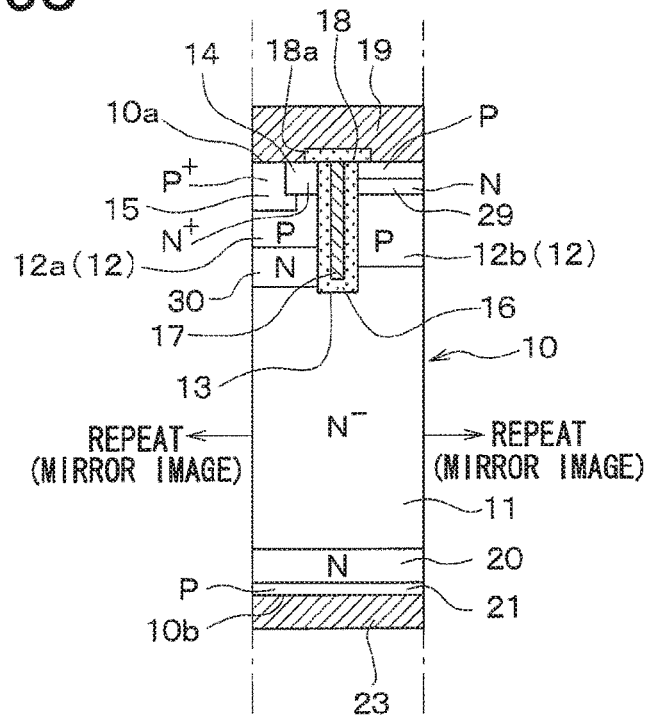
FIG. 15C is a diagram illustrating a structure of the smallest unit of an IGBT device according to another embodiment of the present disclosure.

Yet alternatively, the IGBT region 1a may be formed by repeatedly forming a mirror image of a structure in which a hole stopper layer 29 and a carrier storage layer (CS layer) 30 formed between a channel region 12a and a drift layer 11 are included, as illustrated in FIG. 15C. This can prevent holes accumulated in the drift layer 11 from going out from an upper electrode 19 through the channel region 12a.

Although not specifically shown in the figure, the IGBT region 1a may also be formed by repeatedly forming a mirror image of a structure in which the hole stopper layer 29 is not formed in FIG. 15C.

Figure 16:
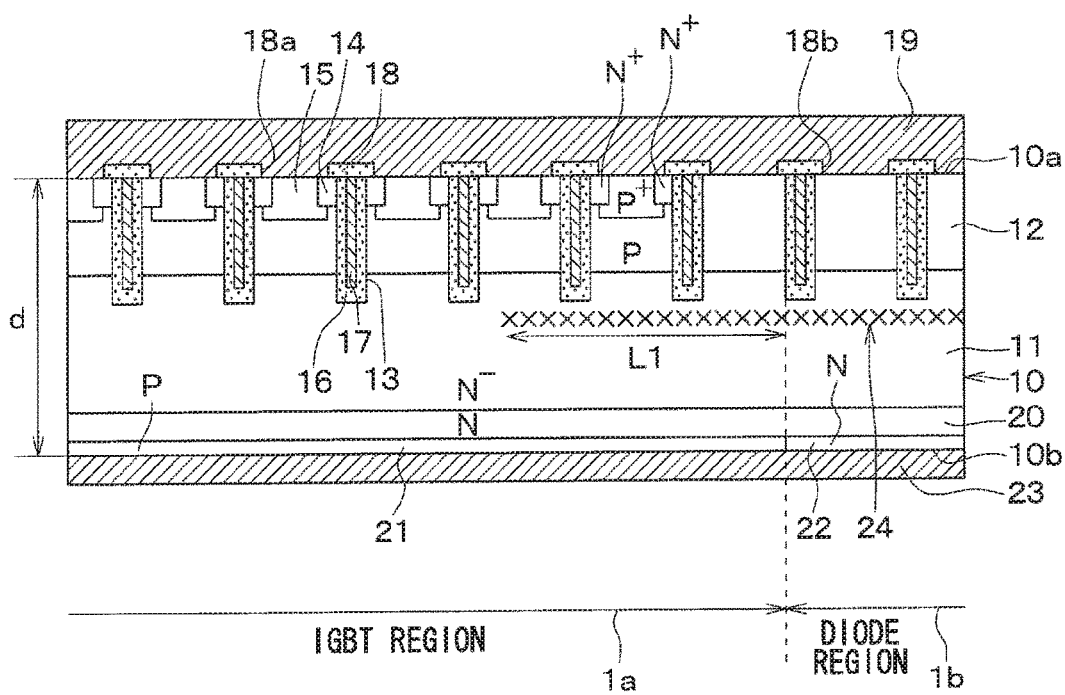
FIG. 16 is a cross-sectional view of a semiconductor device according to another embodiment of the present disclosure.

Moreover, according to the first embodiment, the IGBT region 1a and the diode region 1b are demarcated by the boundary between the base layer 12 in which the emitter region 14 and the body region 15 are formed and the base layer 12 in which the emitter region 14 and the body region 15 are not formed. The IGBT region 1a and the diode region 1b are however demarcated by the layers formed on the other surface 10b side of the semiconductor substrate 10, the layers being the collector layer 21 and the cathode layer 22. Accordingly, as illustrated in FIG. 16, the IGBT region 1a and the diode region 1b may be demarcated between adjacent base layers 12 in which the emitter region 14 and the body region 15 are not formed. This means that the base layer 12 in which the emitter region 14 and the body region 15 are not formed may be formed on the side of the boundary with the diode region 1b in the IGBT region 1a. Such a semiconductor device can also have improved recovery characteristics of the diode region 1b by forming a damaged region 24 with a first thickness ratio (L1/d) of one or larger in the IGBT region 1a.

Figure 17:
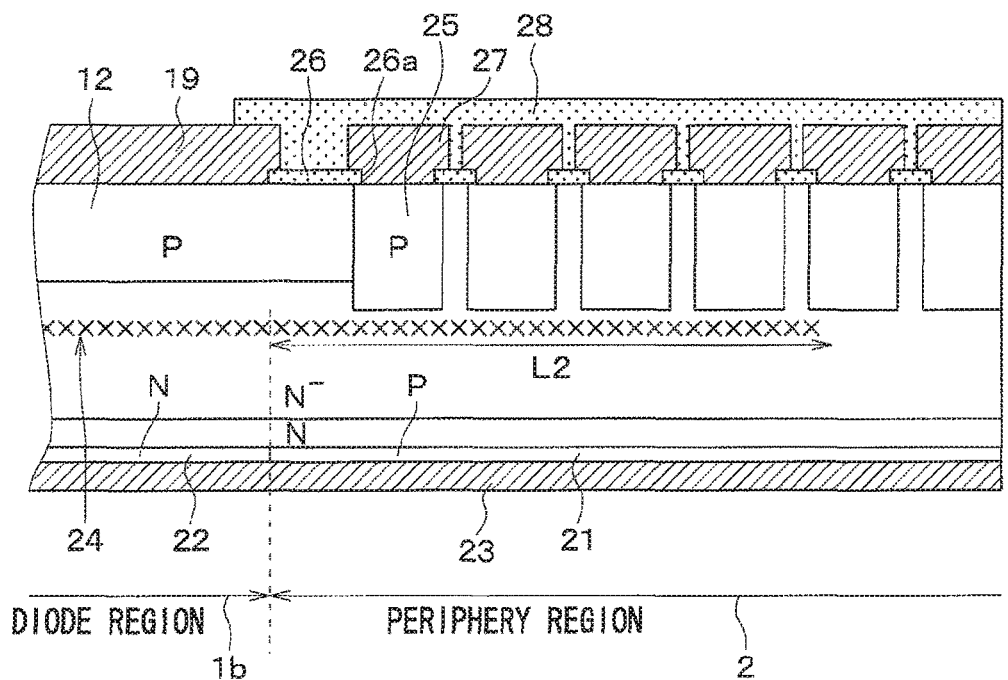
FIG. 17 is a cross-sectional view of a semiconductor device according to another embodiment of the present disclosure.

Likewise, in the second embodiment, the diode region 1b and the periphery region 2 may be formed while splitting the base layer 12 as illustrated in FIG. 17. This means that the base layer 12 may be formed on the side of the boundary with the diode region 1b in the periphery region 2. Such a semiconductor device can also have improved recovery characteristics of the diode region 1b by forming a damaged region 24 with a second thickness ratio (L2/d) of two or larger in the periphery region 2.

Figure 18:
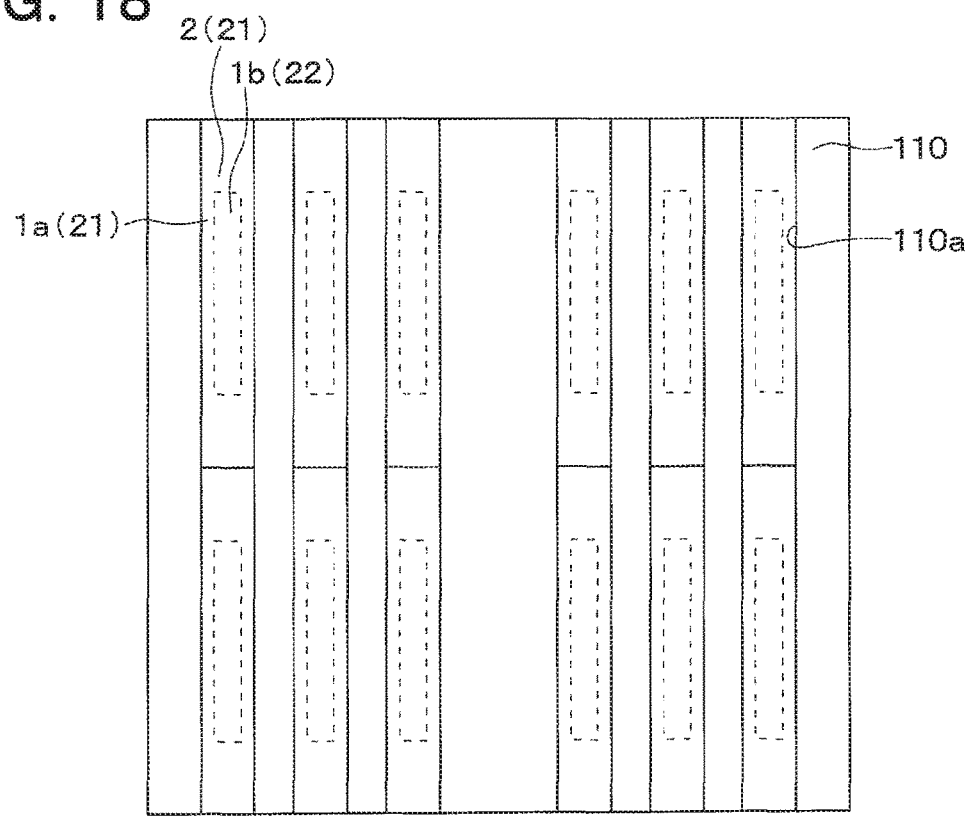
FIG. 18 is a schematic plan view of a semiconductor device according to another embodiment of the present disclosure.

Moreover, in the second embodiment, the damaged region 24 formed in the periphery region 2 may be formed up to an edge of the semiconductor substrate 10 along a direction in which the diode region 1b extends. In this case, as illustrated in FIG. 18, a mask 110 can be profiled easily as there can be used the mask 110 in which an opening 110a and a shield portion (mask portion) form a stripe.

Then in the first embodiment, there may be formed the mask 110 with the opening 110a opposing an area in which the damaged region 24 is formed by superposing a plurality of masks in which the opening 110a and the shield portion form the stripe. Likewise, in the second and third embodiments, there may be formed the mask 110 with the opening 110a opposing to the area in which the damaged region 24 is formed by superposing the plurality of masks in which the opening 110a and the shield portion form the stripe.

Figure 19:
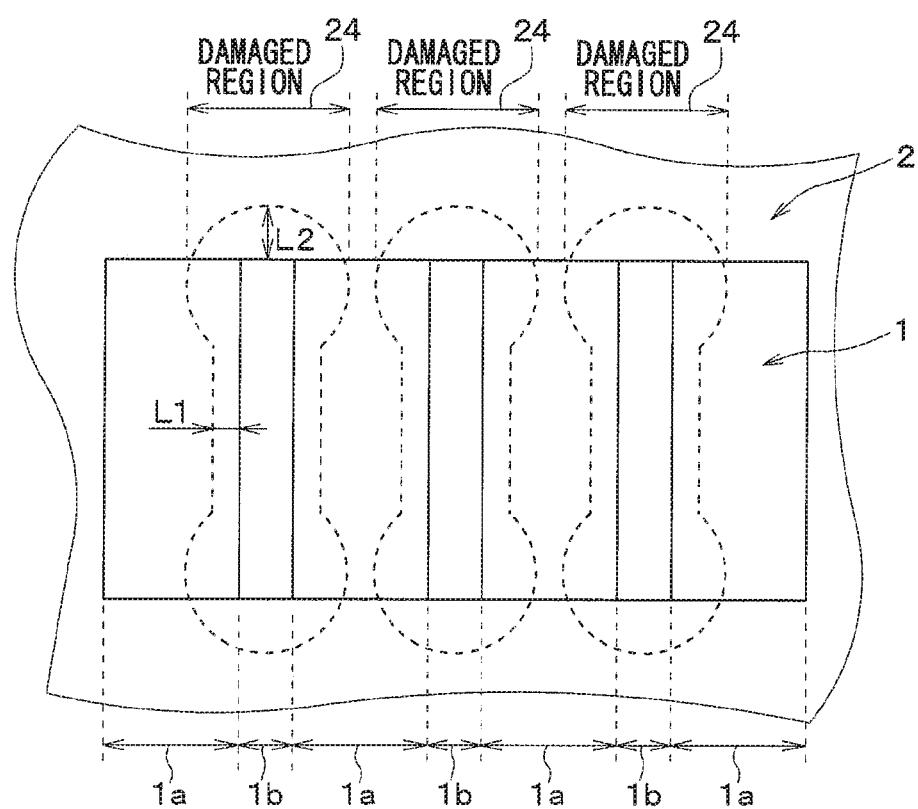
FIG. 19 is a schematic plan view when a mask is arranged on another surface side of a wafer, according to another embodiment of the present disclosure.

Moreover, in the third embodiment, a part of the damaged region 24 formed on both end sides along the extension of the diode region 1b may have a circular planar shape as illustrated in FIG. 19. The damaged region 24 can have the circular shape with a second thickness ratio (L2/d) of two or larger at the center of a part formed in the periphery region 2, for example.

The invention claimed is:

1. A semiconductor device comprising:
  a semiconductor substrate including:
    a drift layer having a first conductivity type;
    a base layer having a second conductivity type that is arranged at a surface portion of the drift layer; and
    a collector layer having the second conductivity type and a cathode layer having the first conductivity type that are arranged at a side of the drift layer opposite to another side of the drift layer facing the base layer, wherein:
    when a region operating as an IGBT device in the semiconductor substrate is an IGBT region and a region operating as a diode device in the semiconductor substrate is a diode region, the IGBT region and the diode region are arranged alternately in a repetitive manner;
    a damaged region is arranged at a surface portion of the diode region in the semiconductor substrate;
    the IGBT region and the diode region are demarcated by a boundary between the collector layer and the cathode layer;
    a surface portion of the IGBT region includes: a portion that has the damaged region, which has a length along a surface direction of the semiconductor substrate equal to or larger than the thickness of the semiconductor substrate, at a boundary side with the diode region; and another portion not having the damaged region that is arranged closer to an inner periphery side relative to the boundary side; and
    a width of a region where the damaged region is not arranged equals one half or more of a width of the entire IGBT region.

2. The semiconductor device according to claim 1, wherein:
  the semiconductor substrate includes a periphery region surrounding the IGBT region and the diode region; and
  the periphery region includes the collector layer having the second conductivity type arranged adjacent to the cathode layer and is demarcated from the diode region by the boundary between the collector layer and the cathode layer, and includes the damaged region, which has a length along the surface direction of the semiconductor substrate twice or more larger than the thickness of the semiconductor substrate, at a part of a surface portion on the boundary side with the diode region.

3. The semiconductor device according to claim 1, wherein the damaged region arranged at the IGBT region has an area, which is arranged on both end sides of the boundary between the diode region and the IGBT region, with a length along the surface direction of the semiconductor substrate longer than an area of the damaged region arranged at a central portion between both ends of the boundary.

4. The semiconductor device according to claim 1, wherein:
  in the IGBT region, one portion of the base layer is a channel region and a remaining portion of the base layer is a float region;
  in the IGBT region, an emitter region having the first conductivity type is arranged at a surface portion of the channel region;
  in the IGBT region, a hole stopper layer having the first conductivity type is arranged in the float region and splits the float region in a thickness direction of the semiconductor substrate; and,
  in the IGBT region, a carrier storage layer having the first conductivity type with a higher impurity concentration than the drift layer is arranged between the channel region and the drift layer.

5. The semiconductor device according to claim 1, wherein:
  the entire IGBT region extends in a lateral direction parallel to an extension direction of the collector layer across the semiconductor substrate above the collector layer.

* * * * *